United States Patent [19]
Del Signore et al.

[11] Patent Number: 5,157,395
[45] Date of Patent: Oct. 20, 1992

[54] VARIABLE DECIMATION ARCHITECTURE FOR A DELTA-SIGMA ANALOG-TO-DIGITAL CONVERTER

[75] Inventors: Bruce Del Signore; Eric J. Swanson; Jeffrey M. Klaas; David L. Medlock, all of Austin, Tex.

[73] Assignee: Crystal Semiconductor Corporation, Austin, Tex.

[21] Appl. No.: 664,034

[22] Filed: Mar. 4, 1991

[51] Int. Cl.$^5$ .................. H03M 7/32; G06F 15/31
[52] U.S. Cl. .................................. 341/143; 364/724.1
[58] Field of Search .............. 341/143, 110, 126, 144, 341/155; 364/724.1, 724.13, 724.16, 724.01

[56] References Cited

U.S. PATENT DOCUMENTS

| | | | |
|---|---|---|---|
| 4,588,979 | 5/1986 | Adams | 341/143 X |
| 4,746,899 | 5/1988 | Swanson et al. | 364/724.1 |
| 4,851,841 | 7/1989 | Sooch | 341/143 |
| 4,999,626 | 3/1991 | Asghar et al. | 364/724.01 X |
| 5,012,245 | 4/1991 | Scott et al. | 341/144 X |
| 5,051,981 | 9/1991 | Kline | 370/32.1 |

OTHER PUBLICATIONS

Friedman et al., "A Dual-Channel Voice-Band PCM Codec Using ΣΔ Modulation Technique", IEEE Journal of Solid State Circuits, vol. 24, No. 2, Apr. 1989.

Friedman et al., "A Bit-Slice Architecture for Sigma-Delta Analog-To-Digital Converters", IEEE Journal of Solid State Circuits, 1988.

*Primary Examiner*—Sharon D. Logan
*Attorney, Agent, or Firm*—Ross, Howison, Clapp & Korn

[57] ABSTRACT

An analog-to-digital converter includes a delta-sigma modulator (10), having the output thereof filtered by a digital filter section. The digital filter section includes a first fixed decimation filter (12) followed by a variable decimation filter section (14) and an output low-pass filter section (16), having a fixed decimation ratio. The fixed variable decimation filter section (14) includes a single FIR filter (24) that has data processed therethrough with different sampling rates. A recursive controller (26) receives an external configuration input to determine the number of passes through the filter (24) that are required to provide the desired decimation ratio.

38 Claims, 5 Drawing Sheets

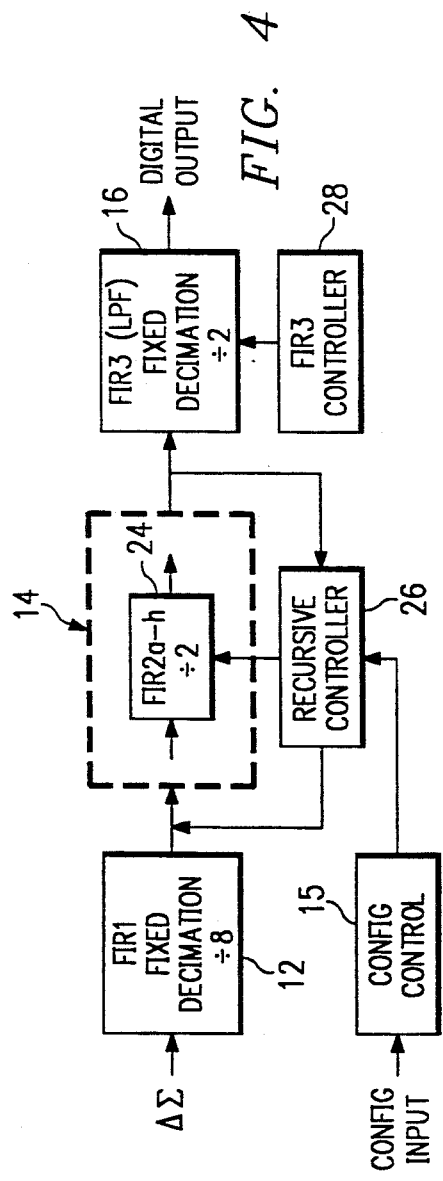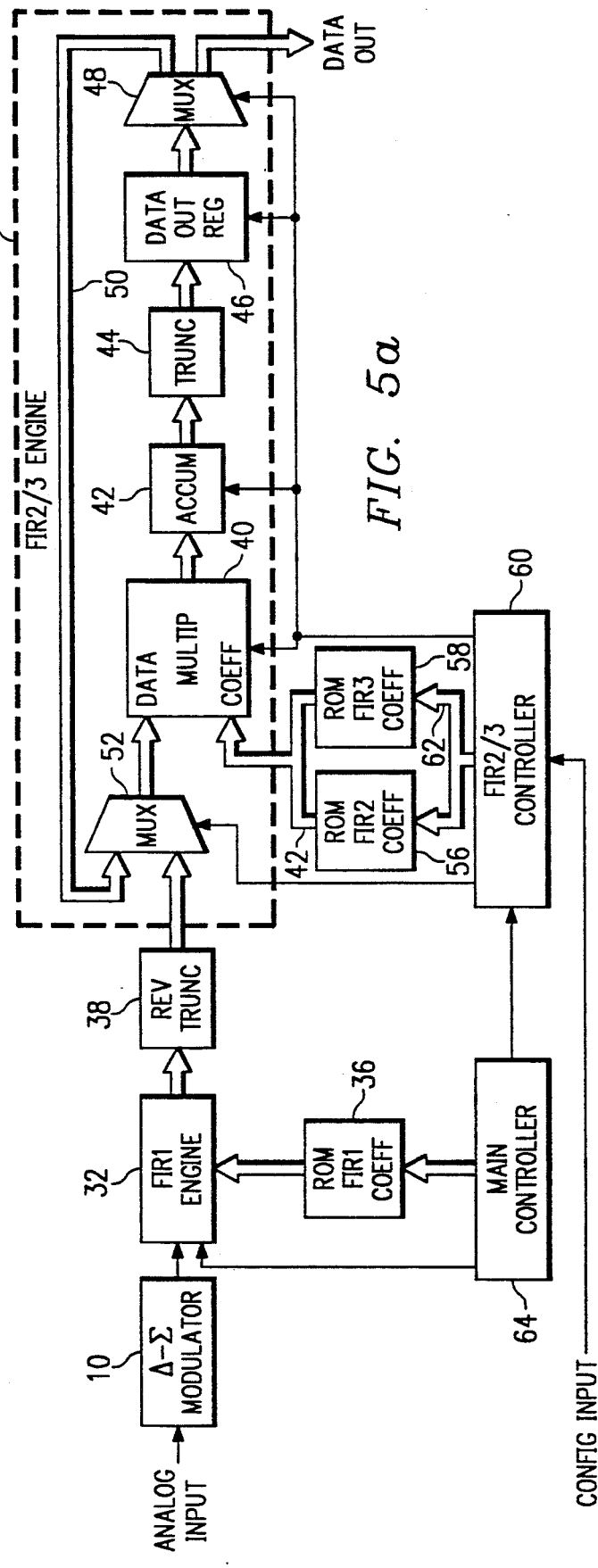

FIRST FILTER SECTION

SECOND FILTER SECTION

THIRD FILTER SECTION

COMPOSITE FILTER

_5,157,395_

VARIABLE DECIMATION ARCHITECTURE FOR A DELTA-SIGMA ANALOG-TO-DIGITAL CONVERTER

TECHNICAL FIELD OF THE INVENTION

The present invention pertains in general to analog-to-digital converters, and more particularly, to the digital filter of the analog-to-digital filter and the use of variable decimation therein.

BACKGROUND OF THE INVENTION

Oversampling analog-to-digital converters (ADC) generally consists of two parts, an analog modulator and a digital filter. The first part, the analog modulator, receives an analog signal and produces a serial data stream having a bit rate which is much greater than the Nyquist sampling frequency. The quantization noise of the analog modulator is shaped to minimize the noise in the passband of interest, at the expense of higher noise outside of this passband. This is as opposed to distributing the noise evenly between DC and the modulator sampling frequency. The digital filter portion of the ADC is operable to filter and decimate the modulator output to a lower frequency, higher resolution digital representation of the analog input. Since the modulator quantization noise is shaped, the digital filter must filter this out-of-band quantization noise and reduce the output word frequency to twice the effective Nyquist frequency. Decimation is a well-known technique that is utilized in most oversampling ADCs.

In some applications utilizing decimation, the output sampling rate must be set at one of a plurality of sampling rates. In order to provide for these different sampling rates, an ADC needs to have the ability to select one of a plurality of decimation rates to provide the selected output sampling rate. This must either be done by providing a plurality of ADCs with fixed and separate decimation rates or to perform some control of the digital filter to effect a variable decimation rate architecture.

Conventional digital filters in ADCs utilize some form of digital signal processor utilizing multiple stages of digital filtering. These stages of digital filtering typically utilize a finite impulse response (FIR) filter topology which requires at minimum a multiplier and an accumulator and stored filter coefficients that define the transfer function of the filter. The data is processed with the multiplier and accumulator utilizing the stored filter coefficients. Each set of filter coefficients is designed to provide a specific decimation rate and filter transfer function. In order to provide a variable decimation rate, it is necessary to process data through multiple filter stages with the number of filter stages varied. With conventional digital filter processors with unlimited processing power, select filter topologies and the order thereof can be realized. However, an ADC that is incorporated into an integrated circuit has limited silicon real estate available and, therefore, incorporating the full power of a digital signal processor is not feasible. Typically, oversampling ADCs have utilized a fixed decimation architecture to realize a desired filter transfer function.

SUMMARY OF THE INVENTION

The present invention disclosed and claimed herein comprises an analog-to-digital converter having an analog modulator and a digital filter section. The analog modulator is operable to convert an analog signal into an m-bit digital word. The m-bit digital word is input to a first digital filter section having a fixed decimation ratio and operable to decimate the m-bit digital word from a first sampling frequency to a second and lower sampling frequency. The output of the first digital section is input to a second digital filter section which has a variable decimation ratio. The decimation ratio is selected in response to receiving a configuration control signal, the second digital filter section then operable to receive the output digital signal from the first digital filter section at the second sampling frequency and decimated to a third sampling frequency that is lower than the second sampling frequency in accordance with the variable decimation ratio.

In another embodiment of the present invention, the second digital filter section is comprised of plurality of fixed decimation filter sections. Each of the filter sections has a different and fixed decimation ratio. A configuration controller is provided for selecting one of the plurality of fixed decimation filters to receive the output of the fixed digital filter section and provide the output of the digital filter.

In yet another aspect of the present invention, the second digital filter section is comprised of a plurality of fixed decimation filter sections, each having a fixed decimation ratio and an input and an output. A configuration controller is provided for selecting one of the fixed decimation filter sections for cascading in a predetermined order, with the input of one of the selected fixed decimation filter sections connected to the output of a preceding one of the fixed decimation filter sections in the cascaded configuration. The last of the cascaded fixed decimation filter sections provides the output of the digital filter. The decimation ratio for each of the fixed decimation filter sections and the associated transfer functions are substantially the same.

In a further aspect of the present invention the second digital filter section is comprised of a single fixed decimation filter section having an input and an output and a fixed decimation ratio. The fixed decimation filter section is operable to process data at different sampling rates. A clock is provided for generating the different sampling rates for input to the fixed decimation filter section. A controller controls the fixed decimation filter section to process data therethrough in a plurality of passes, each pass operating at a different sampling rate. The output of the fixed decimation filter section for each pass is stored in an output register with the data in the output register from a previous pass comprising the input data for the next subsequent pass. The output register provides the output data of the digital filter section after the last pass.

BRIEF DESCRIPTION OF THE DRAWINGS

For a more complete understanding of the present invention and the advantages thereof, reference is now made to the following description taken in conjunction with the accompanying Drawings in which:

FIG. 4 illustrates another embodiment of the present invention utilizing a single FIR filter that is recursively controlled to provide the variable decimation;

FIG. 5a illustrates a detailed block diagram of the present invention;

DETAILED DESCRIPTION OF THE INVENTION

Figure 1:
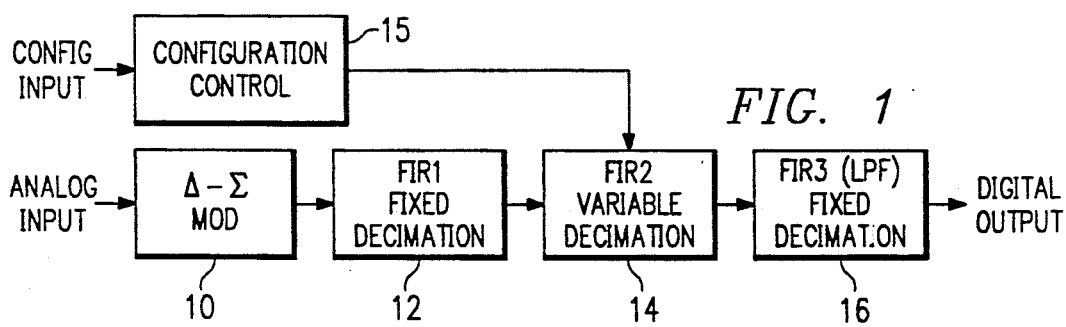
FIG. 1 illustrates a block diagram of the ADC of the present invention utilizing a variable decimation digital filter.

Referring now to FIG. 1, there is illustrated a block diagram of the ADC of the present invention. The analog input is received on the input of a delta-sigma modulator 10 that is operable to convert the analog input signal into a digital one-bit stream that has a "1"s density proportional to the analog input voltage. In the preferred embodiment, the sampling rate of the one-bit stream is 256 kHz. The output of the delta-sigma modulator 10 is input to a finite impulse response filter 12 which has a fixed decimation rate of 8, resulting in decimation of the sampling frequency to 32 kHz. Therefore, the sampling frequency of the modulator $f_{sm}$ of 256 kHz is reduced at the output of the first filter stage 12 to a sampling frequency $f_{s1}$ of 32 kHz. The filter 12 is configured without using a multiplier since the input string is a one-bit string and only has two logic states. The filter has associated therewith twenty-nine FIR filter coefficients, with the sum of the coefficients equalling 4096. Therefore, the output of the filter 12 is a twelve-bit output.

The output of the first stage filter 12 is input to a variable section 14 that has a variable decimation rate. The variable decimation filter section 14 receives the twelve-bit input and provides on the output thereof a twenty four-bit signal having a selectable sampling frequency, resulting from the variable decimation rate. The decimation rate of the filter section 14 is selectable with a configuration input signal that is input to a configuration control circuit 15. In the preferred embodiment, eight decimation rates are selectable with three input pins provided for receiving a three-bit word. This three-bit word is decoded by the configuration control circuit 15 to select the variable decimation rate provided by the variable decimation filter section 14.

The output of the variable decimation filter section 14 is input to an output filter stage 16. The output filter stage 16 has a fixed decimation rate of two and functions as a low pass filter. In the preferred embodiment, there are effectively three filter sections, the first filter section 12 referred to as having a transfer function FIR1, the variable filter section 14 having the transfer function FIR2 and the output filter section 16 having the transfer function FIR3. By utilizing this architecture, separate hardware can be employed for the first filter section 12 to provide the transfer function FIR1 separate from the remainder of the digital filter. In this manner, separate circuitry can be utilized to realize the transfer function FIR1, which must decimate a sampling frequency $f_{sm}$ of 256 kHz to an output frequency $f_{o1}$ of 32 kHz. By utilizing separate circuitry for this stage, it is possible to utilize higher frequency components to initially decimate the digital input and then relax the circuitry requirements on subsequent filter stages.

Since most digital filters share common functional components such as multipliers and accumulators, the bandwidth requirements for portions of the filter having lower sampling frequencies would be governed by the highest sampling frequency processed by the common components. Therefore, with the architecture of the present invention, the separate circuitry utilized for the initial decimation, therefore relaxing the hardware requirements on the subsequent filter stages. Further, a separate filter section is utilized for the output filter stage 16 having a separate set of coefficients, as will be described hereinbelow. The requirements for the output low pass filtering operation are significantly different from the requirements for the transfer functions of the intermediate and input filter sections. As such, a separate filter section is utilized. By utilizing this architecture, the constraints associated with the decimation filter section 14 can be separated from the output of the low pass filter output stage 16 and the higher sampling rate requirements of the input filter section 10.

Figure 2:
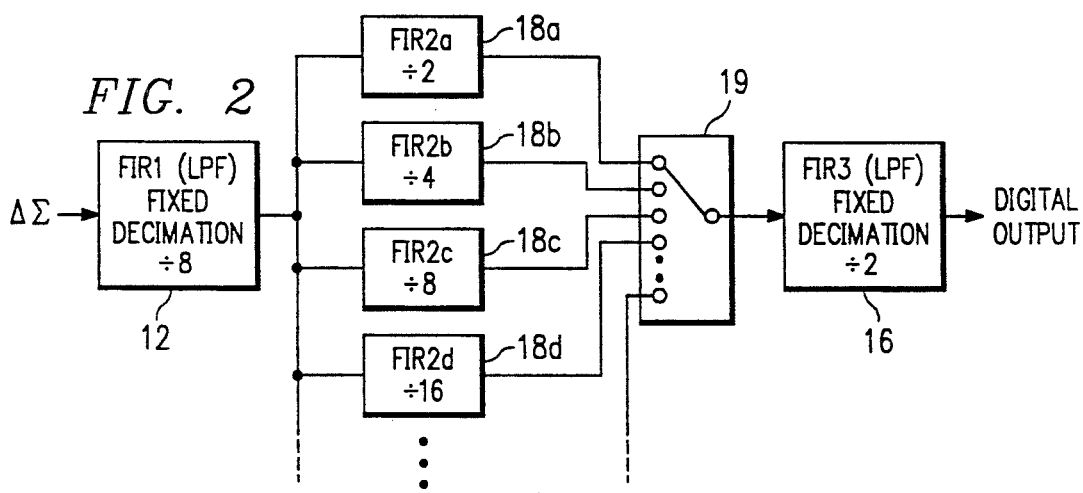
FIG. 2 illustrates one embodiment of the digital filter of the present invention utilizing a plurality of discrete digital filters that are individually selectable.

Referring now to FIG. 2, there is illustrated one embodiment of the present invention illustrating the variable decimation filter section 14. The variable decimation filter section 14 is comprised of a plurality of separate filter sections 18a, 18b, 18c, 18d, etc. Each of the filter sections 18a–18d, etc., have a separate decimation rate, which is selectable by a four-input, one-output switch 19 for input to the output stage 16. The filter section 18a decimates by a ratio of two. The filter section 18b decimates by a ratio of four. The filter section 18c decimates by a ratio of eight. The filter section 18d decimates by a ratio of sixteen, etc. Therefore, if a decimation ratio of two is desired, the configuration control 15 (not shown in FIG. 2) will select the coefficients that will provide the decimation ratio of two in filter section 18a. The hardware to provide the filter transfer function and the decimation ratio will be essentially the same with the exception of the size of the multiplier and the accumulator. However, a separate set of filter coefficients will have to be provided for this particular filter function, with each of the different filter transfer functions requiring longer length filter sections as the decimation ratio increases.

Figure 3:
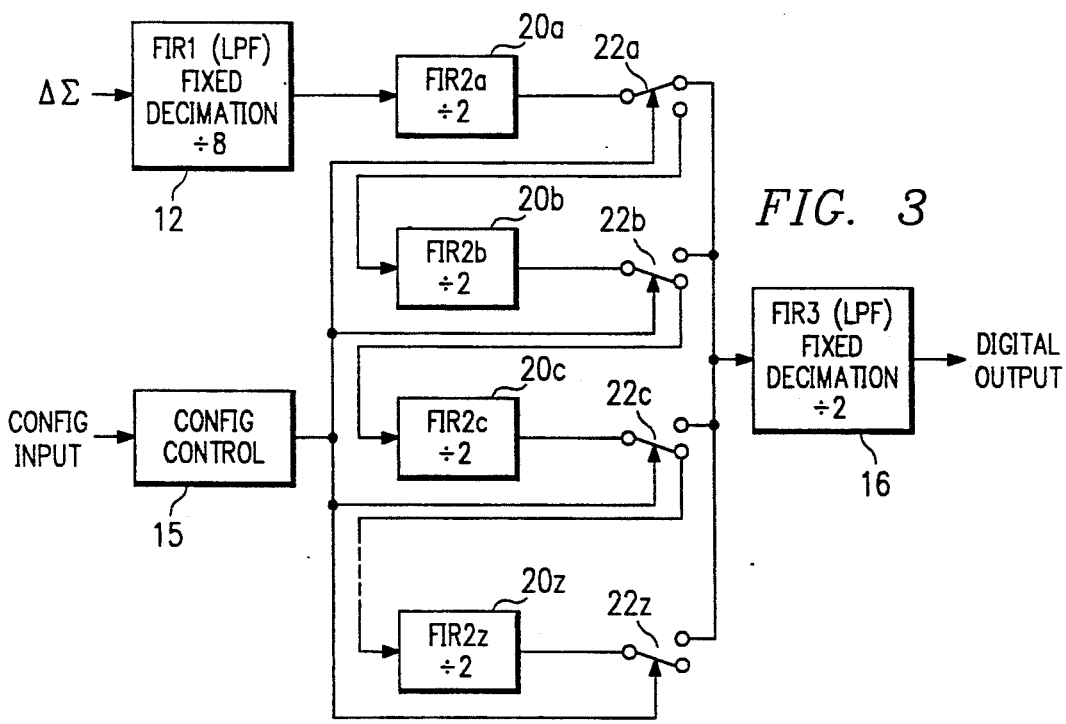
FIG. 3 illustrates another embodiment of the present invention utilizing a plurality of cascaded FIR filters, the order of which is selectable.

Referring now to FIG. 3, there is illustrated another embodiment of the present invention wherein a plurality of filter sections 20a–20z are provided. The filter sections 20a–20z are arranged in a cascadeable configuration. A plurality of switches 22a–22z are provided that are associated with each of the filter sections 20a–20z, respectively, to switch the output thereof to either the input of the next stage or to the input of the third stage 16. The switches 22a–22z are controlled by the configuration control 15. For example, the output of filter section 20a can be connected to the input of the third filter stage 16 when switch 22a is in the up position (shown in FIG. 3) or the output of filter section 20a can be connected to the input of filter section 20b when the switch is in the down position. At any one time, only one of the switches is in the up position and the remaining switches are in the down position.

In operation, each of the filter sections 20a–20z provides a decimation ratio of two. Therefore, if only filter section 20a were utilized to provide a total decimation ratio of two, switch 22a would be in the up position and the output of filter section 20a would serve as an input to filter section 16. The overall decimation ratio would be provided only by filter section 20a. However, if a decimation ratio of four were required, filter sections 20a and 20b would be cascaded with only switch 22b in the up position. Further, if a decimation ratio of eight were desired, this would utilize filter sections 20a, 20b and 20c, with only switch 22c in the up position.

From a design standpoint, the filter section 20a would require the most stringent specifications from a circuitry standpoint to provide acceptable performance. For example, if only one filter section 20a is used and the decimation ratio of the filter section is set to two, this would mean that the input sampling frequency $f_s$ would be equal to 32 kHz and the output frequency $f_{o2a}$ would be equal to 16 kHz with a requirement of the bandwidth $f_b$ being equal to 2 kHz to provide an $f_s/f_b$ of sixteen. However, if five filter sections 20a-20e are utilized, the sampling frequency input to filter section 20a would be 32 kHz and the output frequency $f_{o2a}$ would be 16 kHz, but the bandwidth requirement would be 0.125 kHz. This provides an $f_s/f_b$ of 256.

The variable decimated filter section 14 of FIG. 3, utilizing the filter sections 20a-20z is essentially realized with a common multiplier with a number of accumulator sections of different lengths. Data registers are provided with a filter controller that is operable to process separate filter coefficients for each of the filter sections 20a-20z in accordance with the filter transfer function and the associated filter coefficients. Each of the filter sections 20a-20z can have a different filter transfer function and, therefore, a set of different filter coefficients. The set of switches 22a-22z are illustrative only, and are generally embodied in the filter controller and the operation thereof.

Therefore, with cascaded configuration of more than one filter section and a higher resultant decimation ratio, the requirements on each of the filter sections is reduced, whereas if only one of the filter sections were utilized to provide the digital filtering, the requirements on that filter section would be the highest from a circuitry standpoint. Therefore, the topology of FIG. 3 would require that the filter section at the top of the chain, filter section 20a, be designed with coefficients that provide for a worst case scenario. The requirements for this are illustrated in the following Table. Five combinations are illustrated from one filter section through five filter sections in combination with the output section 16, wherein the input sampling rate is 32 kHz and the output $f_s/f_b$ ratio is equal to eight.

TABLE 1

| #1 | #2 | #3 | #4 | #5 |
|---|---|---|---|---|
| $f_s$ = 32 k | $f_s$ = 32 k | $f_s$ = 32 k | $f_s$ = 32 k | $f_s$ = 32 k |
| $f_o$ = 16 k | $f_o$ = 16 k | $f_o$ = 16 k | $f_o$ = 16 k | $f_o$ = 16 k |
| $f_b$ = 2 k | $f_b$ = 1 k | $f_b$ = .5 k | $f_b$ = .25 k | $f_b$ = .125 k |
| $f_s/f_b$ = 16 | $f_s/f_b$ = 32 | $f_s/f_b$ = 64 | $f_s/f_b$ = 128 K | $f_s/f_b$ = 256 |
| $f_s$ = 16 k | $f_s$ = 16 k | $f_s$ = 16 k | $f_s$ = 16 k | $f_s$ = 16 k |
| $f_o$ = 4 k | $f_o$ = 8 k | $f_o$ = 8 k | $f_o$ = 8 k | $f_o$ = 8 k |
| $f_b$ = 2 k | $f_b$ = 1 k | $f_b$ = .5 k | $f_b$ = .25 k | $f_b$ = .125 k |
| $f_s/f_b$ = 8 | $f_s/f_b$ = 16 | $f_s/f_b$ = 32 | $f_s/f_b$ = 64 K | $f_s/f_b$ = 128 |
|  | $f_s$ = 8 k | $f_s$ = 8 k | $f_s$ = 8 k | $f_s$ = 8 k |
|  | $f_o$ = 2 k | A{{$f_o$ = 4 k | $f_o$ = 4 k | $f_o$ = 4 k |
|  | $f_b$ = 1 k | $f_b$ = .5 k | $f_b$ = .25 k | $f_b$ = .125 k |
|  | $f_s/f_b$ = 8 | $f_s/f_b$ = 16 | $f_s/f_b$ = 32 | $f_s/f_b$ = 64 |
|  |  | $f_s$ = 4 k | $f_s$ = 4 k | $f_s$ = 4 k |
|  |  | $f_o$ = 1 k | $f_o$ = 2 k | $f_o$ = 2 k |
|  |  | $f_b$ = .5 k | $f_b$ = .25 k | $f_b$ = .125 k |
|  |  | $f_s/f_b$ = 8 | $f_s/f_b$ = 16 | $f_s/f_b$ = 32 |
|  |  |  | $f_s$ = 2 k | $f_s$ = 2 k |
|  |  |  | $f_o$ = 1 k | $f_o$ = 1 k |
|  |  |  | $f_b$ = .25 k | $f_b$ = .125 k |
|  |  |  | $f_s/f_b$ = 8 | $f_s/f_b$ = 16 |
|  |  |  |  | $f_s$ = 1 k |
|  |  |  |  | $f_o$ = .5 k |
|  |  |  |  | $f_b$ = .125 k |
|  |  |  |  | $f_s/f_b$ = 8 |

Referring now to FIG. 4, there is illustrated a block diagram of the preferred embodiment of the present invention. The filter section is generally made up of a single filter section 24 that provides a decimation ratio of two. The filter section 24 is connected in a recursive manner with a recursive filter controller 26 such that only one set of filter coefficients is required, and only one multiplier and one accumulator is required in order to provide the multiple recursive operations. Therefore, the filter transfer function for the filter section 24 is designed such that it will operate in the worst case conditions. As described above with reference to FIG. 3, this worst case condition would exist where the decimation ratio was two, as illustrated with only filter section 20a being inserted. The output filter section 16 is controlled by a FIR3 controller 28.

In the specific architecture utilized with the present invention, the first filter section 10 is a multiplierless FIR filter that decimates the serial bit stream output by the delta-sigma modulator 10 from a sampling frequency $f_{sm}$ to a new sampling frequency $f_{s2a}$ where $f_{s2a}=f_{sm}/8$. This filter also acts as an anti-aliasing filter for the next stage of filtering and therefore, it must reject all multiples of the sampling frequency $f_{s2a}$ of the second stage. Since the sampling process of the second filter stage will alias all signals at multiples of $f_{s2a}$ down to DC, any signals in the frequency windows defined by $(N*f_{s2a}-f_{pb}<N*f_{s2b}+f_{pb})$, where $f_{pb}$ is the passband, will be moved into the passband. The first stage of filtering must have sufficient rejection of noise in these bands. The frequency response in the preferred embodiment performs a fourth order sinc function and has a monotonic roll-off in the passband, but any function which has zeroes at the sampling rate of the next stage will work.

The output signal of the one-bit analog-to-digital modulator 10 is multiplied by the tap weights of the first filter stage 12 and summed together to perform a convolution. Since the modulator outputs are either a "1" or a "−1", an actual multiplier is not needed since only addition or subtraction of tap weights are performed.

The final stage of filtering in the output stage 16 is a fixed decimate-by-two stage. This is a Chebychev low pass FIR filter that decimates the output of the final second-stage filter to a frequency $f_{s3}/2$. This output stage 16 therefore attenuates the remaining quantization noise in the $f_{pb}$ passband frequency to the $f_{s3}/2$. In addition, the output stage 16 compensates for attenuation on the first stage 12, and the second stage 14 that is present in the passband. This filter section 16 is chosen to have a minimum decimation rate, two, since the number of taps required for a digital low-pass, high-pass or band-pass filter is directly related to the ratio of the filter's transition bandwidth to its sampling rate. Minimizing taps requires low decimation rate. The output stage 16 has a response that tracks the decimation rate so that for any decimation rate chosen, the ratios of passband, transition band, or 3 dB bandwidth to sample rate remains constant.

The second stage filter 14, as described above, is a single decimate-by-two filter that is utilized in a recursive manner. This is an iterative process to decimate by a factor of two, four, eight, sixteen . . . by simply passing the signal through the filter section more than one time ($f_{s2b}=f_{s2a}/2$, $f_{s2c}=f_{s2b}/2$, $f_{s2d}=f_{s2c}/2$. . . $f_{s2z}=f_{s2y}/2$). From the standpoint of timing and control, this provides a relatively simple filter. With the exception of a different clock rate, all control signals are identical. Further, this utilizes significantly less silicon area since one filter requires much less area than many filters. However, memory is required to temporarily store the outputs each time the filter is used. Since memory area is relatively inexpensive from a silicon real estate standpoint, this provides a minimal disadvantage for this filter.

The variable stage filter section 14 must also act as an anti-aliasing filter for each successive stage of filtering and, therefore, it must have sufficient rejection of noise in any band aliased into the pass band. In the preferred embodiment, the filter implemented performs a twelfth order sinc function with thirteen taps and has a monotonic roll-off in the passband, but any function which has zeroes at the one-half of its sampling rate will work. In the preferred embodiment, 24-bit data is used. The second stage filter can therefore only be used up to eight times. This equates to 24*13*8=2496 bits of memory, which is realizable with conventional technology. In the present configuration, as described above, the first stage filter section 12 and the second stage variable decimation filter section 14 eliminate all quantization noise greater than the output stage filter section 16 sampling rate $f_{s3}$.

Referring now to FIG. 5a, there is a illustrated a detailed block diagram of the ADC of FIG. 4 for the preferred embodiment. There are two engines provided, a FIR1 engine 32 and a FIR2/3 engine 34. The FIR1 engine 32 is utilized to implement the first stage of filtering 12 with the FIR2/3 engine 34 utilized to realize the variable decimation filter section 14 and the output filter section 16. The FIR1 engine 32 has associated therewith a Read Only Memory (ROM) 36 that stores the FIR1 coefficients. These are utilized by the FIR1 engine 32 to implement the filter transfer function to decimate the input sampling frequency of 256 kHz to a sampling frequency of 32 kHz. As described above, this is a multiplierless filter section and utilizes only a single accumulator and is conventional. However, the hardware utilized to realize the FIR1 engine 32 is separate from that utilized for the remainder of the filtering. The output of the FIR1 engine is a 12-bit digital word at a sampling frequency of 32 kHz. The FIR1 coefficients are stored in ROM 36, comprised of twenty-nine coefficients, the sum of the coefficients being 4096. The FIR2/3 engine 34 utilizes a 24-bit data input and, therefore, a reverse truncation circuit 38 is disposed between the output of the FIR1 engine 32 and the FIR2/3 engine 34 to provide the 24-bit input.

The FIR2/3 engine 34 is comprised at the heart thereof of a multiplier 40 that receives a 24-bit data input and also a 24-bit coefficient from a coefficient bus 42. The multiplier 40 is operable to multiply the data and the coefficients and output the result to an accumulator 42. The output of the accumulator is a 55-bit word that is truncated to a 24-bit word by a truncation circuit 44, the output of which is input to a data output register 46. The output of the data output register 46 is input to a multiplexer 48. The output of the multiplexer 48 is configured such that it either provides the data output if the data has finished processing or feeds back the data along a bus 50 to one input of a multiplexer 52 that has the output thereof input to the data input of the multiplier 40. The multiplexer 52 is operable to select between the feedback bus 50 or the 24-bit output of the reverse truncation circuit 38. Therefore, in operation, data is initially input to the multiplier 40 from the output of the reverse truncation circuit 38, which represents a 32 kHz decimated output of the FIR1 engine 32. Thereafter, the data is processed a maximum of eight times plus one time for the output stage 16 (as will be described hereinbelow), to provide the data output. During operation, the variable decimation filter section 14 is realized by passing the data through the multiplier 40 and accumulator 42 utilizing a single set of coefficients for each pass, the coefficients stored in a ROM 56. On the last pass through the FIR2/3 engine 34, a separate set of coefficients for the output stage 16 are utilized, which are stored in a ROM 58. A controller 60 is operable to address the ROMs 56 and 58 on an address bus 62 and also control the operation of the multiplexers 48 and 52, the multiplier 40, the accumulator 42 and the data output register 46 to process the data in accordance with the configuration input and the coefficients stored in ROMs 56 and 58. The overall operation of the digital filter is controlled by a main controller 64 that controls the processing of data through the FIR1 engine 32 and initiation of operation by the FIR2/3 controller 60 to process data therethrough.

Figure 5B:
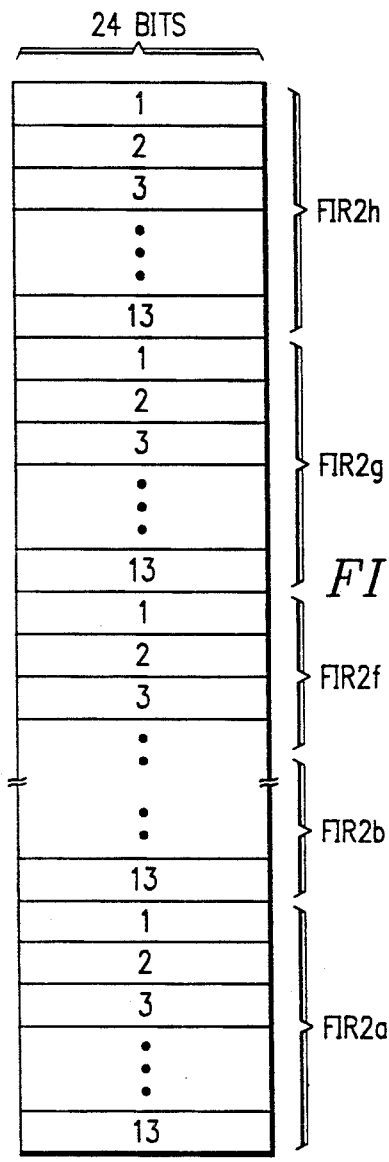
FIG. 5b illustrates a diagrammatic view of data registers.

Referring now to FIG. 5b, there is illustrated a diagrammatic view of the data output register 46, illustrating the configuration wherein eight passes through the variable decimation filter section 14 are required. Since there are thirteen taps in each of the filter sections, thirteen data words will be generated. After the first data word is input to the multiplier 40, it is multiplied by the appropriate one of the coefficients. The result is then passed through the accumulator 42 into the data output register 46 for the first pass. After the first pass has been performed, the data in the data output register is then passed back as input data to the multiplier 40 and processed with the next set of filter coefficients, which in the preferred embodiment are identical to the coefficients for the first pass, and then the data generated in the first pass processed as input data in the second pass. This continues until the initial data has been processed through the full eight passes. Thereafter, the data stored in the data output register 46 is processed through the FIR2/3 engine 34 with the coefficients in ROM 58 to realize the output stage 16. The entire operation is performed in a pipeline manner with each section operating at a different sampling rate.

Figure 6:
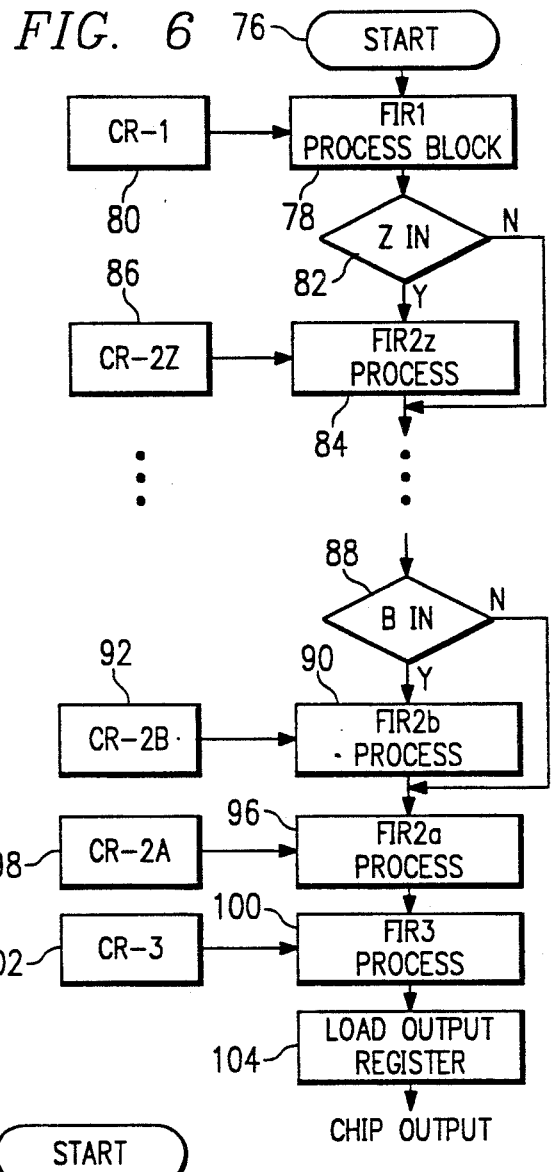
FIG. 6 illustrates a flowchart for the operation of the digital filter of the present invention.

Referring now to FIG. 6, there is illustrated a flowchart for the general operation of the variable decimation digital filter. The system is initiated at a block 76, with data being input to the FIR1 process block 78. The data is processed in accordance with the filter transfer function of the FIR1 process utilizing filter coefficients in a coefficient register CR-1, indicated by block 80. Data is then output and a decision is made at a decision block 82 to determine if the last filter process, the FIR2$z$ process, is to be utilized. If so, the data is processed through the FIR2$z$ process in block 84 with the coefficients associated therewith in a coefficient register CR-2$z$, represented by a block 86. If not, the program flows from the decision block 82 around to the output of the FIR2$z$ process block 84. This continues for each of the FIR processes 2$a$–2$z$ from the FIR2$z$ process to the FIR2$a$ process. The FIR2$b$ process is selected by a decision block 88 that determines whether the FIR2$b$ process is to be utilized. If so, the program would flow along the "Y" path to a block 90 to perform the FIR2$b$ process in accordance with the coefficients stored in coefficient register CR-2$b$, as indicated by block 92. If not, the program would flow along an "N" path from the decision block 88 to the output of the FIR2$b$ process 90. The process finally flows into a FIR2$a$ process block 96 which processes the data in accordance with the coefficients stored in a coefficient register CR-2$a$, indicated by a block 98, and then the program flows to a function block 100 indicating the FIR3 process, which processes the data in accordance with the coefficients stored in the coefficient register CR-3, as indicated by a block 102. The data is then loaded into an output register, as indicated by function block 104, and then the chip output is provided. The flowchart of FIG. 6 depicts the embodiment of FIG. 3.

Figure 7:
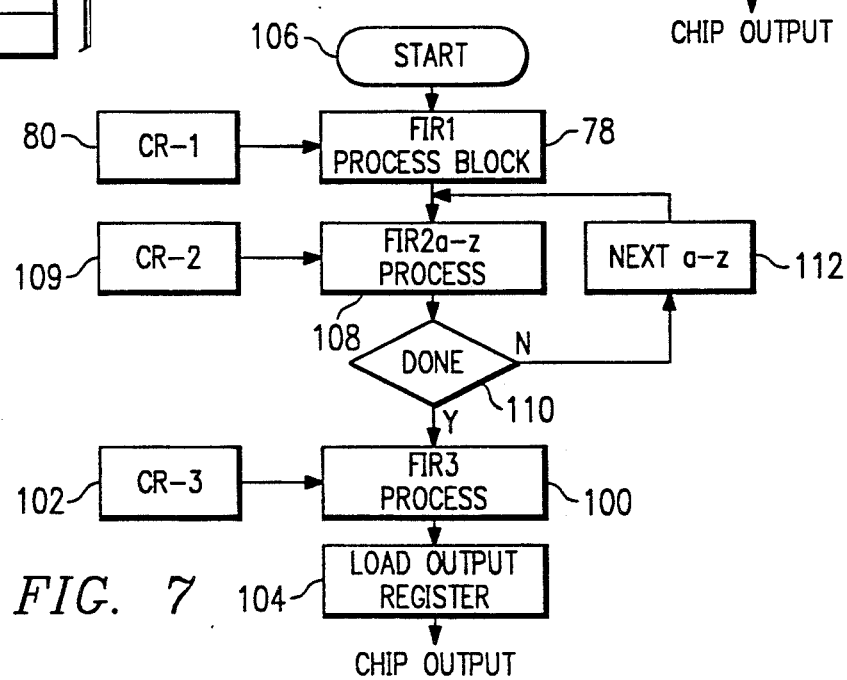
FIG. 7 illustrates a flowchart for the preferred embodiment of the digital filter.

Referring now to FIG. 7, there is illustrated a flowchart depicting the process of the preferred embodiment illustrated by FIGS. 4 and 5. The process is initiated at a start block 106 wherein the data is processed by the FIR1 process block 78 in accordance with coefficients in the coefficient register 80, similar to that illustrated above with respect to FIG. 6. The output of the FIR1 process block 78 is input to a single FIR2$a$–$z$ process block 108, which processes the data in accordance with the externally input configuration information, subtracting all or one of the processes. The FIR-2$a$–$z$ process block 108 indicates a single process which is recursively implemented in an iterative manner with coefficients stored in a coefficient register CR-2, indicated by block 109. After data is processed through the process block 108, the program flows to a decision block 110 to determine if this was the last pass. If not, the program flows along the "N" path to a function block 112 to select the next process or pass, and then the data is input back to the input of process block 108 to again process the data in accordance with the coefficients stored in the coefficient register 109. This continues until the selected number of passes has been performed, after which the program flows along the "Y" path from decision block 110 to the FIR3 process block 100, wherein the data is processed in accordance with the coefficients in coefficient register CR-3 in block 102 and then loaded into the output register.

Figure 8:
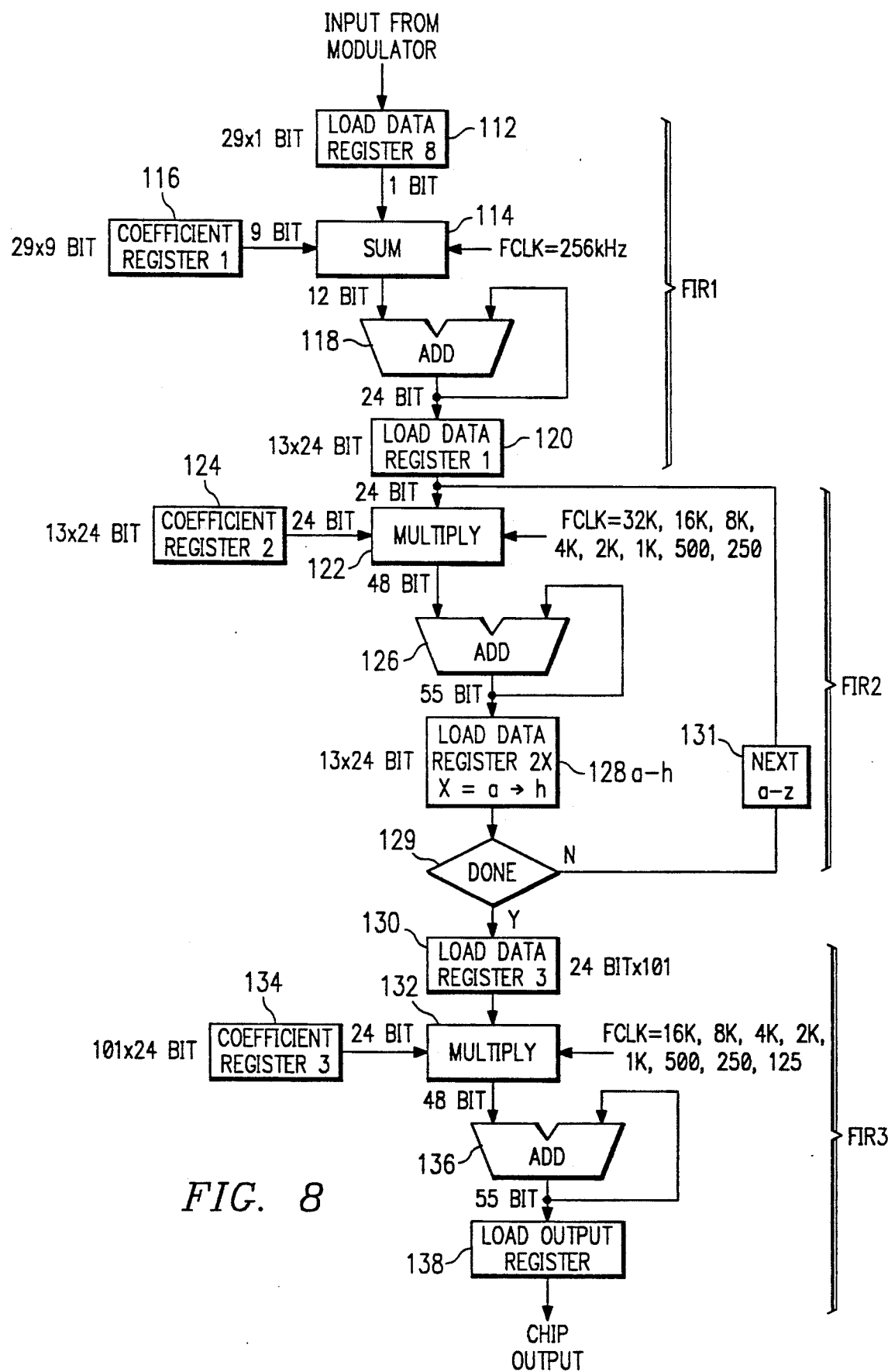
FIG. 8 illustrates a more detailed flowchart corresponding to the flowchart of FIG. 7.

Referring now to FIG. 8, there is illustrated a more detailed flowchart for the flowchart of FIG. 7 for processing data for up to eight passes a–h. The program is initiated by first loading the data output by the analog modulator 10 into a 29×1-bit register, as indicated by a function block 112. Each of the data bits is then output from the register 112 to a summing circuit 114, which receives on the other input thereof the 24-bit coefficient from a first coefficient register 116. The coefficient register 116 is a 29×9-bit register which has twenty-nine 9-bit words stored therein. Each of these bits is output with addition and subtraction of the coefficients performed in accordance with whether the input is a "1" or a "−1". This provides a 12-bit word that is output from the sum circuit 114 and input to an accumulator circuit 118. The other input of the accumulator 118 is connected to the output thereof, the output being a 24-bit output. The data is accumulated for an entire pass and then loaded into a 13×24-bit register, as indicated by a block 120. The blocks 112 through 120 represent the process performed by the first filter section 12, indicating the FIR1 process.

After the data has been loaded into the data register at the output of the FIR1 filter process, the 24-bit data is then input to a multiplier, indicated by a block 122, which has a variable clock rate input thereto, this clock rate being 32 kHz, 16 kHz, 8 kHz, 4 kHz, 2 kHz, 1 kHz, 500 Hz, or 250 Hz, depending upon which pass of the variable decimation rate filter section 14 is being performed. The multiplier 122 is operable to multiply the 24-bit input data word by a 24-bit coefficient which is stored in a coefficient register 124. Coefficient register 124 is a 13×24-bit register having thirteen tap weights stored therein. Each of the tap weights is output for multiplication with one of the thirteen 24-bit words stored in the register 120. For the first pass, the clock rate would be set at 32 kHz for a sampling rate $f_{s2a}$ of 32 kHz. The output of the multiplier 122 is then input to one input of an accumulator 126, the other input connected to the output thereof. The results of the accumulation and multiplication operation are loaded into an associated data register 128$a$–$h$ (indicating sufficient capacity to store data for eight passes a–h). The output of the appropriate register is then connected back to the input of the multiplier 122, through a decision block 129 and increment block 131 and the clock rate shifted for this process. This continues until all the selected passes a–h have been performed. The blocks 122–128 indicate the operation of the FIR2 process of the variable decimation filter section 14.

After processing through the FIR2 process, the data is then loaded into a 24-bit×101 data register as indicated by block 130 and the output thereof multiplied with a multiply block 132 with the coefficients stored in a coefficient register 134. The coefficient register 134 is a 101×24-bit coefficient register, indicating that there are 101 taps for the output filter function. The output of the multiplier is connected to one input of an accumulator block 136, the other input of which is connected to the output thereof. The output of the accumulator is then input to a block 138, indicating a step wherein the output load register is loaded. This provides a chip output.

Figure 9A:
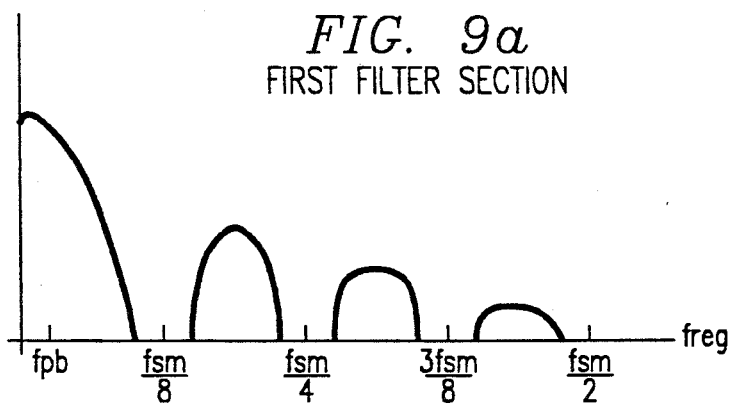
FIGS. 9a–9d illustrate frequency responses for the various filter stages.

Referring now to FIGS. 9a-9d, there are illustrated frequency responses for each of the filter sections and the composite frequency response. The frequency response for the first filter section is illustrated in FIG. 9a. It can be seen that attenuation is provided at $f_{sm}/8$, $f_{sm}/4$, $3f_{sm}/8$, $f_{sm}/2$... with a transition band defined around each of the attenuation points. The noise in these transition bands is aliased into the base band by the next subsequent filter, the second filter section.

Figure 9B:
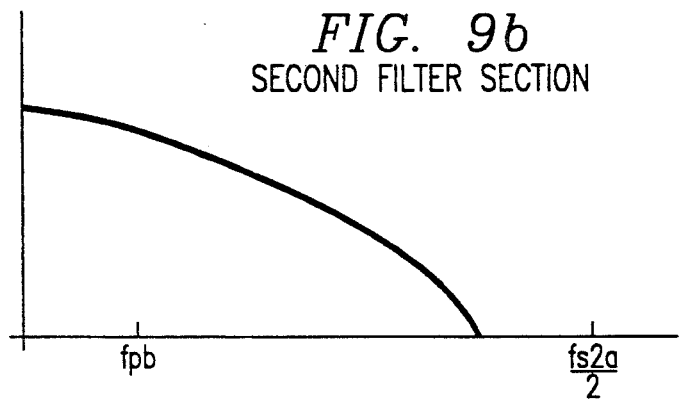

FIG. 9b illustrates the frequency response for the second filter section. Essentially, the attenuation is provided at $f_{s2a}/2$ with a transition band disposed thereabout. Noise in the transition band is aliased into the baseband by the next filter section, the output filter section 16.

Figure 9C:
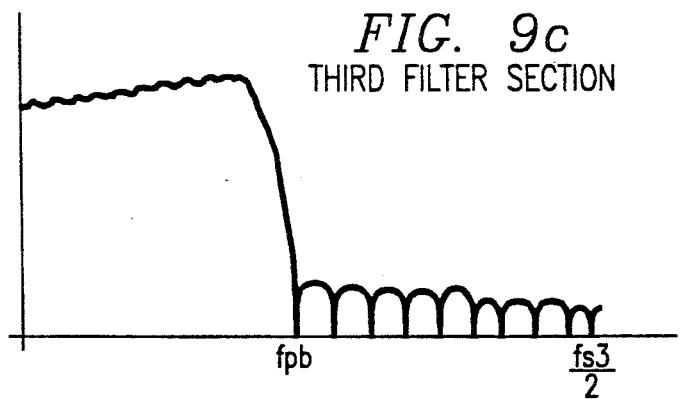
Figure 9D:
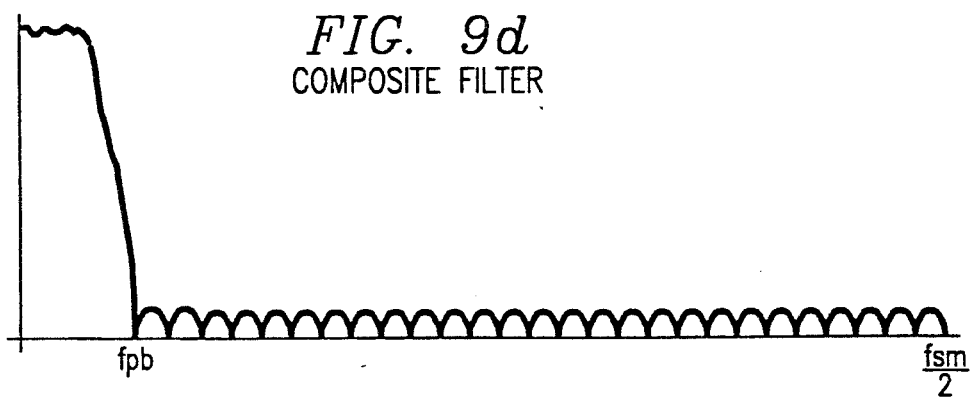

FIG. 9c illustrates the frequency response for the output low-pass filter section 16, illustrating a sharp drop off at the frequency $f_{pb}$. Some compensation is made in the passband for the purposes of compensating the inband frequency response of the first and second filter sections. FIG. 9d illustrates the composite frequency response. A list of the filter coefficients is illustrated in Appendix A, with c1(1–29) relating to the first stage, c2(1–13) relating to the second and variable decimation stage and c(1–101) relating to the third LPF output stage.

In summary, there has been provided a variable decimation rate digital filter utilizing a three section filter. The three section filter is comprised of a first fixed decimation rate filter section, a variable decimation rate filter section and an output low-pass filter section having a fixed decimation rate. The variable decimation filter section utilizes a single filter section that is recursively processed with a single set of coefficients. Data is therefore processed through a single section with the sampling frequency varied for each pass.

Although the preferred embodiment has been described in detail, it should be understood that various changes, substitutions and alterations can be made therein without departing from the spirit and scope of the invention as defined by the appended claims.

APPENDIX A c1(1) = 1
c1(2) = 4
c1(3) = 10
c1(4) = 20
c1(5) = 35
c1(6) = 56
c1(7) = 84
c1(8) = 120
c1(9) = 161
c1(10) = 204
c1(11) = 246
c1(12) = 284
c1(13) = 315
c1(14) = 336
c1(15) = 344
c1(16) = 336
c1(17) = 315
c1(18) = 284
c1(19) = 246
c1(20) = 204
c1(21) = 161
c1(22) = 120
c1(23) = 84
c1(24) = 56
c1(25) = 35
c1(26) = 20
c1(27) = 10
c1(28) = 4
c1(29) = 1

APPENDIX A -continued c2(1) = 8192
c2(2) = 98304
c2(3) = 540672
c2(4) = 1802240
c2(5) = 4055040
c2(6) = 6488064
c2(7) = 7569408
c2(8) = 6488064
c2(9) = 4055040
c2(10) = 1802240
c2(11) = 540672
c2(12) = 98304
c2(13) = 8192
c3(1) = −26
c3(2) = −247
c3(3) = −822
c3(4) = −1362
c3(5) = −839
c3(6) = 1012
c3(7) = 2197
c3(8) = 212
c3(9) = −3443
c3(10) = −3077
c3(11) = 3156
c3(12) = 7168
c3(13) = 256
c3(14) = −10709
c3(15) = −7644
c3(16) = 10713
c3(17) = 18055
c3(18) = −3873
c3(19) = −28007
c3(20) = −11826
c3(21) = 31641
c3(22) = 35194
c3(23) = −22177
c3(24) = −60427
c3(25) = −5404
c3(26) = 77065
c3(27) = 51056
c3(28) = −71982
c3(29) = −106905
c3(30) = 33416
c3(31) = 156296
c3(32) = 43678
c3(33) = −175718
c3(34) = −152409
c3(35) = 139856
c3(36) = 270573
c3(37) = −29083
c3(38) = −360427
c3(39) = −162173
c3(40) = 371807
c3(41) = 417807
c3(42) = −246840
c3(43) = −693181
c3(44) = −78388
c3(45) = 902497
c3(46) = 685231
c3(47) = −865217
c3(48) = −1713558
c3(49) = −262
c3(50) = 3276208
c3(51) = 4950471
c3(52) = 3276208
c3(53) = −262
c3(54) = −1713558
c3(55) = −865217
c3(56) = 685231
c3(57) = 902497
c3(58) = −78388
c3(59) = −693181
c3(60) = −246840
c3(61) = 417807
c3(62) = 371807
c3(63) = −162173
c3(64) = −360427
c3(65) = −29083
c3(66) = 270573
c3(67) = 139856
c3(68) = −152409

-continued

APPENDIX A

| | | |
|---|---|---|
| $c_3(69)$ | = | $-175718$ |
| $c_3(70)$ | = | $43678$ |
| $c_3(71)$ | = | $15629$ |
| $c_3(72)$ | = | $33416$ |
| $c_3(73)$ | = | $-106905$ |
| $c_3(74)$ | = | $-71982$ |
| $c_3(75)$ | = | $51056$ |
| $c_3(76)$ | = | $77065$ |
| $c_3(77)$ | = | $-5404$ |
| $c_3(78)$ | = | $-60427$ |
| $c_3(79)$ | = | $-22177$ |
| $c_3(80)$ | = | $35194$ |
| $c_3(81)$ | = | $31641$ |
| $c_3(82)$ | = | $-11826$ |
| $c_3(83)$ | = | $-28007$ |
| $c_3(84)$ | = | $-3873$ |
| $c_3(85)$ | = | $18055$ |
| $c_3(86)$ | = | $10713$ |
| $c_3(87)$ | = | $-7644$ |
| $c_3(88)$ | = | $-10709$ |
| $c_3(89)$ | = | $256$ |
| $c_3(90)$ | = | $7168$ |
| $c_3(91)$ | = | $3156$ |
| $c_3(92)$ | = | $-3077$ |
| $c_3(93)$ | = | $-3443$ |
| $c_3(94)$ | = | $212$ |
| $c_3(95)$ | = | $2197$ |
| $c_3(96)$ | = | $1012$ |
| $c_3(97)$ | = | $-839$ |
| $c_3(98)$ | = | $-1362$ |
| $c_3(99)$ | = | $-822$ |
| $c_3(100)$ | = | $-247$ |
| $c_3(101)$ | = | $-26$ |

What is claimed is:

1. A digital filter for receiving an input digital signal and outputting a decimated digital signal, comprising:
   a first digital filter section having a fixed decimation ratio and for decimating the input digital signal from a first sampling frequency to a second sampling frequency that is lower than said first sampling frequency; and
   a second digital filter section having a variable decimation ratio selected in response to receiving a configuration control signal, said second digital filter section operable to receive a digital signal output at said second sampling frequency from said first digital filter section and to output a digital signal at a third sampling frequency that is lower than said second sampling frequency by a ratio corresponding to said variable decimation ratio.

2. The digital filter of claim 1, and further comprising a configuration input for receiving said configuration control signal, said configuration control signal being externally generated.

3. The digital filter of claim 1, wherein said second digital filter section comprises:
   a plurality of fixed decimation filter sections, each having a different and fixed decimation ratio; and
   a configuration controller for selecting one of said plurality of fixed decimation filter sections for receiving the output of said first digital filter section.

4. The digital filter of claim 1, wherein the input digital signal is a one-bit digital word.

5. The digital filter of claim 4, wherein the input digital signal is generated by a delta-sigma modulator.

6. The digital filter of claim 1, wherein said second digital filter section comprises:
   a plurality of fixed decimation filter sections, each having a fixed decimation ratio and an input and an output; and
   a configuration controller for selecting one or more of said fixed decimation filter sections, each having an associated transfer function, and cascading said selected fixed decimation filter sections with the input of one of said selected fixed decimation filter sections connected to the output of one of said selected fixed decimation filter sections in said cascade configuration, the output of a last of said selected fixed decimation filter sections providing the output of said second digital filter section.

7. The digital filter of claim 6, wherein the decimation ratio of each of said fixed decimation filter sections is substantially identical.

8. The digital filter section of claim 6, wherein the transfer function of each of said fixed decimation filter sections is substantially similar.

9. The digital filter section of claim 6, wherein each of said fixed decimation filter sections are arranged in a predetermined cascadable order.

10. The digital filter of claim 1, wherein said second digital filter section comprises:
    a single fixed decimation filter section having an input and an output, and operating at a fixed decimation ratio and at a plurality of different sampling rates;
    a clock generator for generating said plurality of sampling rates; and
    a controller for processing data through said fixed decimation filter section for a plurality of passes, said controller controlling said clock generator to generate a clock frequency associated with the sampling rate of said fixed decimation filter section during each pass, said controller outputting data from a last of said plurality of passes through said fixed decimation filter section as the output of said second digital filter section.

11. The digital filter of claim 10, and further comprising an output register for storing the data output from said single fixed decimation filter section for each pass therethrough and for outputting the data stored in said output register as the output of said second digital filter section after the last pass through said fixed decimation filter section.

12. The digital filter of claim 11, wherein said fixed decimation filter section is a Finite Impulse Response filter and said fixed decimation filter section comprises:
    a multiplier having first and second inputs for receiving data on one input thereof and for receiving First Impulse Response (FIR) filter coefficients on the second input thereof and for outputting products of said received data and said FIR filter coefficients on said first and second inputs, respectively;
    an accumulator for accumulating the products output by said multiplier for each operation of said multiplier during a given pass as accumulated values, the accumulated values stored in said output register;
    said multiplier and accumulator operating at the sampling rate output by said clock generator;
    a memory for storing said FIR filter coefficients for each pass through said multiplier and accumulator; and
    a multiplexer for accessing the data stored in said output register that was generated from a preceding pass, and inputting the accessed data either to the first input of said multiplier for a given pass, or as the output of said second digital filter section after the last of said plurality of passes through said fixed decimation filter section.

13. The digital filter of claim 1, wherein said first digital filter section is a Finite Impulse Response filter and said second digital filter section is a Finite Impulse Response filter.

14. A digital filter for receiving an input digital signal and outputting a decimated digital signal, comprising:
a single fixed decimation filter section having an input and an output and operating at a fixed decimation ratio and operating at a plurality of different sampling rates for receiving input data at one sampling rate and outputting data at a different sampling rate;
a clock generator for generating said plurality of sampling rates; and
a controller for processing data through said fixed decimation filter section for a plurality of passes, said controller controlling said clock generator to generate a clock frequency associated with the sampling rate of said fixed decimation filter section during each pass, said controller outputting data from a last of said plurality of passes through said fixed decimation filter section as the output decimated digital signal of the digital filter.

15. The digital filter of claim 14, and further comprising an output register for storing the data output from said single fixed decimation filter section for each pass therethrough and for outputting the data stored in said output register as the output decimated digital signal of the digital filter after the last pass through said fixed decimation filter section.

16. The digital filter of claim 15, wherein said fixed decimation filter section is a Finite Impulse Response filter and said fixed decimation filter section comprises:
a multiplier having first and second inputs for receiving data on one input thereof and for receiving First Impulse Response (FIR) filter coefficients on the second input thereof and for outputting products of said received data and said FIR filter coefficients on said first and second inputs, respectively;
an accumulator for accumulating the products output by said multiplier for each operation of said multiplier during a given pass as accumulated values, the accumulated values stored in said output register;
said multiplier and accumulator operating at the sampling rate output by said clock generator;
a memory for storing said FIR filter coefficients for each pass through said multiplier and accumulator; and
a multiplexer for accessing the data in said output register that was generated from a preceding pass and inputting the accessed data either to the input of said multiplier for a given pass, or as the decimated digital signal output by the digital filter after the last of said plurality of passes through said fixed decimation filter section.

17. The digital filter section of claim 14, wherein the input digital signal is a one-bit digital word.

18. The digital filter of claim 17, wherein the input digital signal is received from a delta-sigma modulator.

19. An analog-to-digital converter for receiving an input analog signal and converting it to a digital signal, comprising:
an analog modulator having an output and for converting an analog input signal to an n-bit digital word, where n is an integer;
a first digital filter section having a fixed decimation ratio and for decimating the output of said analog modulator from a first sampling frequency to a second sampling frequency that is lower than said first sampling frequency; and
a second digital filter section having a variable decimation ratio selected in response to receiving a configuration control signal, said second digital filter section operable to receive the output of said analog modulator at said second sampling frequency from said first digital filter section and to output a digital signal at a third sampling frequency that is lower than said second sampling frequency by a ratio corresponding to said variable decimation ratio.

20. The digital filter of claim 19, and further comprising, a third digital filter section having a fixed decimation ratio and providing a low pass filter function, said third digital filter section for receiving and filtering the output of said second digital filter section.

21. The analog-to-digital converter of claim 19, wherein said analog modulator comprises a delta-sigma modulator.

22. The analog-to-digital converter of claim 19, and further comprising a configuration input for receiving said configuration control signal, said configuration control signal being externally generated.

23. The analog-to-digital converter of claim 19, wherein said second digital filter section comprises:
a plurality of fixed decimation filter sections, each having a different and fixed decimation ratio; and
a configuration controller for selecting one of said plurality of fixed decimation filters for receiving the output of said first digital filter section.

24. The analog-to-digital converter of claim 19, wherein the value of n is equal to "1", such that a 1-bit digital stream is output by said analog modulator.

25. The analog-to-digital converter of claim 19, wherein said second digital filter section comprises:
a plurality of fixed decimation filter sections, each having a fixed decimation ratio and an input and an output; and
a configuration controller for selecting one or more of said fixed decimation filter sections, each having an associated transfer function, and cascading said selected fixed decimation filter sections, with the input of one of said selected fixed decimation filters connected to the output of said selected fixed decimation filter sections in said cascade configuration, the output of a last of said selected fixed decimation filter sections providing the output of said second digital filter section.

26. The analog-to-digital converter of claim 25, wherein the decimation ratio of each of said fixed decimation filter sections is substantially identical.

27. The analog-to-digital converter of claim 25, wherein the transfer function of each of said fixed decimation filter sections is substantially similar.

28. The analog-to-digital converter of claim 25, wherein said fixed decimation filter sections are arranged in a predetermined cascadable order.

29. The digital filter of claim 19, wherein said second digital filter section comprises:
a single fixed decimation filter section having an input and an output, and operating at a fixed decimation ratio and at a plurality of different sampling rates;
a clock generator for generating said plurality of sampling rates; and
a controller for processing data through said fixed decimation filter section for a plurality of passes, said controller controlling said clock generator to generate a clock frequency associated with the input sampling rate to said fixed decimation filter section during each pass, said controller outputting the data from the last of said plurality of passes through said fixed decimation filter section as the output of said second digital filter section.

30. The digital filter of claim 29, and further comprising an output register for storing output data from said single fixed decimation filter section for each pass therethrough and for outputting the data stored in said output register as the output of said digital filter after the last pass through said fixed decimation filter section.

31. The digital filter of claim 30, wherein said fixed decimation filter section is a Finite Impulse Response filter and said fixed decimation filter section comprises:
a multiplier having first and second inputs for receiving data on one input thereof and for receiving First Impulse Response (FIR) filter coefficients on the second input thereof and for outputting products of said received data and said FIR filter coefficients on said first and second inputs, respectively;
an accumulator for accumulating the products output by said multiplier for each operation of said multiplier during a given pass as accumulated values, the accumulated values stored in said output register;
said multiplier and accumulator operating at the sampling rate output by said clock generator;
a memory for storing said FIR filter coefficients for each pass through said multiplier and accumulator; and
a multiplexer for accessing the data stored in said output register that was generated from a preceding pass, and inputting the accessed data either to the first input of said multiplier for a given pass, or as the output of said second digital filter section after the last of said plurality of passes through said fixed decimation filter section.

32. The digital filter of claim 19, wherein said first digital filter section is a Finite Impulse Response filter and said second digital filter is a Finite Impulse Response filter.

33. A method for digitally filtering an input digital signal to output a decimated digital signal, comprising the steps of:
providing a first digital filter section;
decimating the input digital signal from a first sampling frequency to a second sampling frequency in the first digital filter section, the second sampling frequency being lower than the first sampling frequency;
providing a second digital filter section having a variable decimation ratio;
selecting the variable decimation ratio in response to receiving a configuration control signal; and
receiving the decimated input signal at the second sampling frequency and outputting a digital signal at a third sampling frequency that is lower than the second sampling frequency by a ratio corresponding to the variable decimation ratio of the second digital filter section.

34. The method of claim 33 wherein the step of providing the second digital filter section comprises providing a plurality of fixed decimation filter sections, each having a different and fixed decimation ratio, and wherein the step of selecting the variable decimation ratio comprises selecting one of the plurality of fixed decimation filter sections for receiving the output of the first digital filter section.

35. The method of claim 33 and further comprising generating the input digital signal with a delta-sigma modulator and outputting a one-bit digital word.

36. The method of claim 33 wherein the step of providing the second digital filter section comprises:
providing a plurality of fixed decimation filter sections, each having a fixed decimation ratio and an input and an output; and
selecting one or more of the fixed decimation filter sections, each having an associated transfer function, and cascading the selected fixed decimation filter sections with the input of one of the selected ones of the fixed decimation filter sections connected to the output of one of the selected fixed decimation filter sections in the cascade configuration, the output of a last of the selected fixed decimation filter sections providing the output decimated digital signal.

37. The method of claim 33 wherein the step of providing the second digital filter section comprises providing a single fixed decimation filter section having an input and an output, and operating at a fixed decimation ratio and at a plurality of different sampling rates and wherein the step of selecting the variable decimation ratio comprises:
providing a clock generator for generating a plurality of sampling rates;
processing data through the fixed decimation filter section for a plurality of passes and controlling the clock generator to generate a clock frequency associated with the sampling rate of the fixed decimation filter section during each pass through the fixed decimation filter section, with each successive pass having a lower associated sampling rate; and
outputting data from the last of the passes through the fixed decimation filter section as the output decimated digital data.

38. A method for digitally filtering an input digital signal and outputting a decimated digital signal having associated therewith a decimated sampling frequency, comprising the steps of:
providing a single fixed decimation filter section having an input and an output and operating at a fixed decimation ratio and operating at a plurality of different sampling rates;
providing a clock generator for generating the plurality of sampling rates;
processing data through the fixed decimation filter section for a plurality of passes;
controlling the clock generator to generate a clock frequency associated with the sampling rate of the fixed decimation filter section during each pass; and
outputting data from a last of the passes to the fixed decimation filter section as the output decimated signal at the decimated sampling frequency.

* * * * *

UNITED STATES PATENT AND TRADEMARK OFFICE
CERTIFICATE OF CORRECTION

PATENT NO. : 5,157,395
DATED : October 20, 1992
INVENTOR(S) : Bruce Del Signore, et. al.

It is certified that error appears in the above-indentified patent and that said Letters Patent is hereby corrected as shown below:

Column 18, Claim 38, prior to "signal", insert -- dogota; --.

Signed and Sealed this

Twenty-first Day of December, 1993

Attest:

BRUCE LEHMAN

Attesting Officer     Commissioner of Patents and Trademarks